(12) United States Patent
Rapp et al.

(10) Patent No.: US 7,710,714 B2
(45) Date of Patent: May 4, 2010

(54) HOUSING FOR SCALE OR LOAD CELL CONTROLLER

(75) Inventors: Geoffrey D. Rapp, Westlake, OH (US);
Robert Scott, Forth Smith, AR (US);
Richard P. Bozzi, Vermillion, OH (US);
Dennis R. Seguin, Jr., Elyria, OH (US)

(73) Assignee: Bettcher Industries, Inc., Birmingham, OH (US)

( * ) Notice: Subject to any disclaimer, the term of this patent is extended or adjusted under 35 U.S.C. 154(b) by 1633 days.

(21) Appl. No.: 10/939,693

(22) Filed: Sep. 13, 2004

(65) Prior Publication Data

US 2006/0054335 A1     Mar. 16, 2006

(51) Int. Cl.
*H05K 5/00* (2006.01)
*G01G 19/22* (2006.01)
*G01G 23/18* (2006.01)
*H01H 9/04* (2006.01)
*F16B 35/02* (2006.01)
*G09G 5/00* (2006.01)
*G06F 3/041* (2006.01)

(52) U.S. Cl. .............................. 361/679.01; 177/25.12; 177/182; 200/302.1; 411/383; 345/156; 345/173

(58) Field of Classification Search .............. 177/25.12, 177/180–182; 361/679.01–679.45, 679.55–679.59; 312/223.1, 223.2; 174/50; 200/302.1; 411/383; 345/156, 157, 168, 169, 173
See application file for complete search history.

(56) References Cited

U.S. PATENT DOCUMENTS

| | | | |
|---|---|---|---|
| 3,444,943 A | 5/1969 | Tytus | |
| 3,898,537 A | 8/1975 | Mayse et al. | |
| 4,219,089 A | 8/1980 | Gard et al. | |
| 4,285,412 A | 8/1981 | Wirth | |
| 4,320,809 A | 3/1982 | Knothe et al. | |

(Continued)

FOREIGN PATENT DOCUMENTS

EP     0 825 810 B1     3/1999

(Continued)

*Primary Examiner*—Jayprakash N Gandhi
*Assistant Examiner*—Nidhi Desai
(74) *Attorney, Agent, or Firm*—Tarolli, Sundheim, Covell & Tummino LLP

(57) ABSTRACT

A housing for a scale or load cell controller suitable for use in harsh environments. The housing includes a moisture-resistant front display unit coupled to a rear interface and mounting unit. The front display unit includes a front housing, a back housing, and a frame overlying a boundary or seal region between the front and back housings to provide a double moisture-resistant seal between the front and back housings. The front display unit defines an interior region including a display and a plurality of user input keys and controller circuitry. The front display unit is removably attachable to the rear interface unit. A moisture-resistant seal is also provided between the front display unit and the rear interface and mounting unit. The rear interface and mounting unit defines a recessed area supporting a battery pack, a power supply and an interface circuit board. Circuitry in the front display unit is electrically coupled to circuitry in the rear interface and mounting unit via an edge connector circuit card that extends through an opening in the front display unit and mates with an edge connector socket supported in the rear interface and mounting unit.

45 Claims, 10 Drawing Sheets

U.S. PATENT DOCUMENTS

| | | | |
|---|---|---|---|
| 4,497,038 A | 1/1985 | Diepold-Scharnitzky et al. | |
| 4,526,246 A | 7/1985 | Patoray | |
| 4,632,199 A | 12/1986 | Ober et al. | |
| 4,651,133 A | 3/1987 | Ganesan et al. | |
| 4,969,112 A | 11/1990 | Castle | |
| 4,992,775 A | 2/1991 | Castle et al. | |
| 5,077,536 A | 12/1991 | Fichot et al. | |
| 5,241,488 A | 8/1993 | Chadima, Jr. et al. | |
| 5,241,695 A | 8/1993 | Roshitsh et al. | |
| 5,471,885 A | 12/1995 | Wagner | |
| 5,545,494 A | 8/1996 | Trumble et al. | |
| 5,568,365 A | 10/1996 | Hahn et al. | |
| 5,611,616 A | 3/1997 | Chandler | |
| 5,613,237 A * | 3/1997 | Bent et al. | 455/351 |
| 5,623,128 A | 4/1997 | Grimm et al. | |
| 5,821,405 A | 10/1998 | Dickey et al. | |
| 5,841,077 A | 11/1998 | Kolaci | |
| 5,901,034 A | 5/1999 | Fuglister | |
| 6,007,351 A | 12/1999 | Gabrisko, Jr. et al. | |
| 6,058,356 A | 5/2000 | Swanson et al. | |
| 6,061,446 A | 5/2000 | Lester et al. | |
| 6,304,455 B1 | 10/2001 | Huber et al. | |
| 6,309,257 B1 | 10/2001 | Huang | |
| 6,359,239 B1 | 3/2002 | Missler et al. | |
| 6,376,783 B1 | 4/2002 | Vaghi | |
| 6,407,911 B1 * | 6/2002 | Spence et al. | 361/679.3 |
| 6,452,514 B1 | 9/2002 | Philipp | |
| 6,484,107 B1 | 11/2002 | Roper et al. | |
| 6,511,337 B1 | 1/2003 | Fandrey et al. | |
| 6,546,805 B2 | 4/2003 | Fandrey et al. | |
| 6,639,156 B2 | 10/2003 | Luke et al. | |
| 6,646,864 B2 * | 11/2003 | Richardson | 361/679.3 |
| 6,686,717 B2 | 2/2004 | Khairallah | |
| 6,731,913 B2 | 5/2004 | Humphreys et al. | |
| 6,880,788 B2 * | 4/2005 | Stephen | 248/68.1 |
| 6,983,130 B2 * | 1/2006 | Chien et al. | 455/90.3 |
| 7,002,084 B2 * | 2/2006 | Cox et al. | 177/238 |
| 7,236,588 B2 * | 6/2007 | Gartrell | 379/433.01 |
| 7,436,653 B2 * | 10/2008 | Yang et al. | 361/679.01 |
| 2003/0133269 A1 | 7/2003 | Cox et al. | |

FOREIGN PATENT DOCUMENTS

| GB | 2064879 | 6/1981 |
|---|---|---|

* cited by examiner

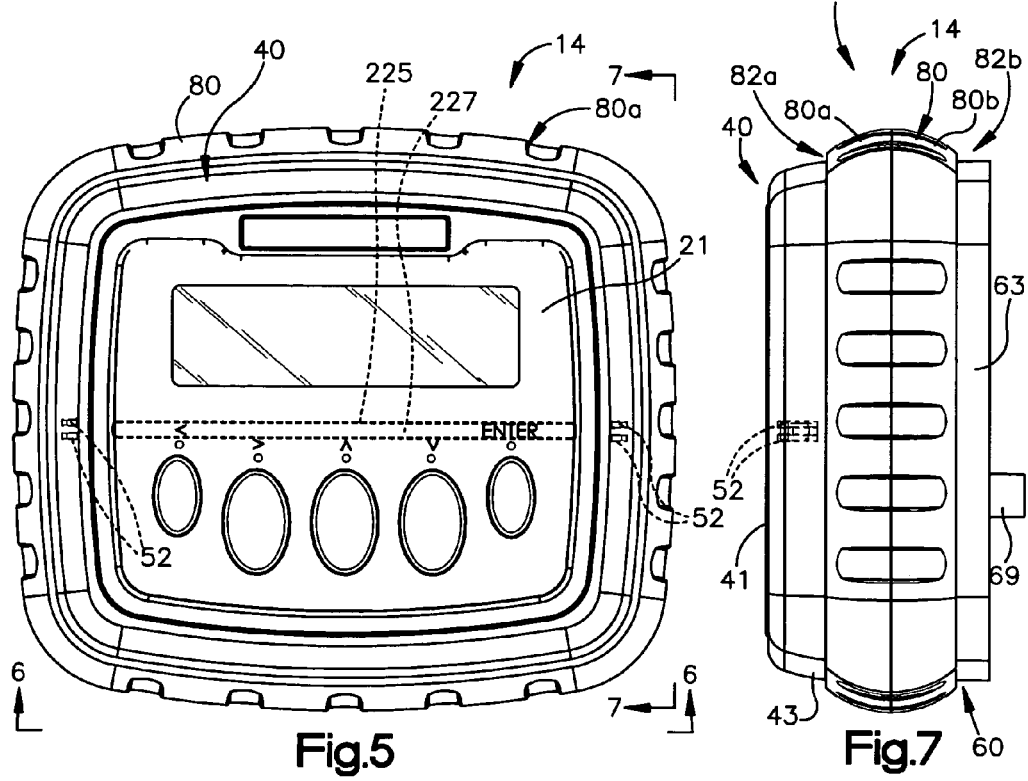
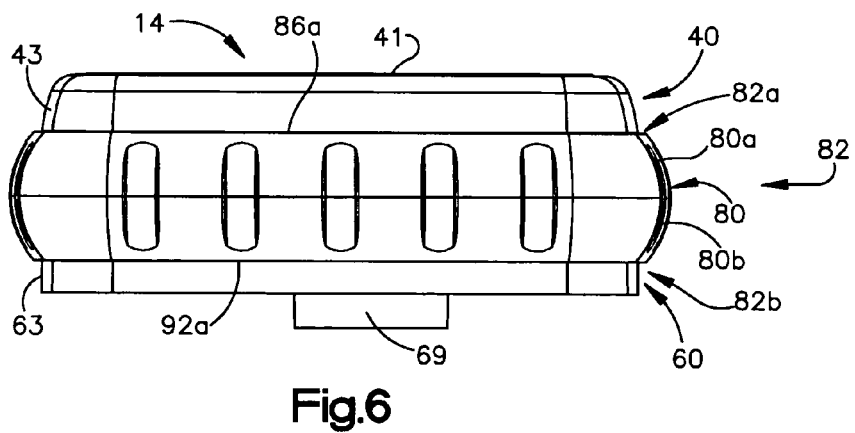
Fig.5
Fig.7
Fig.6

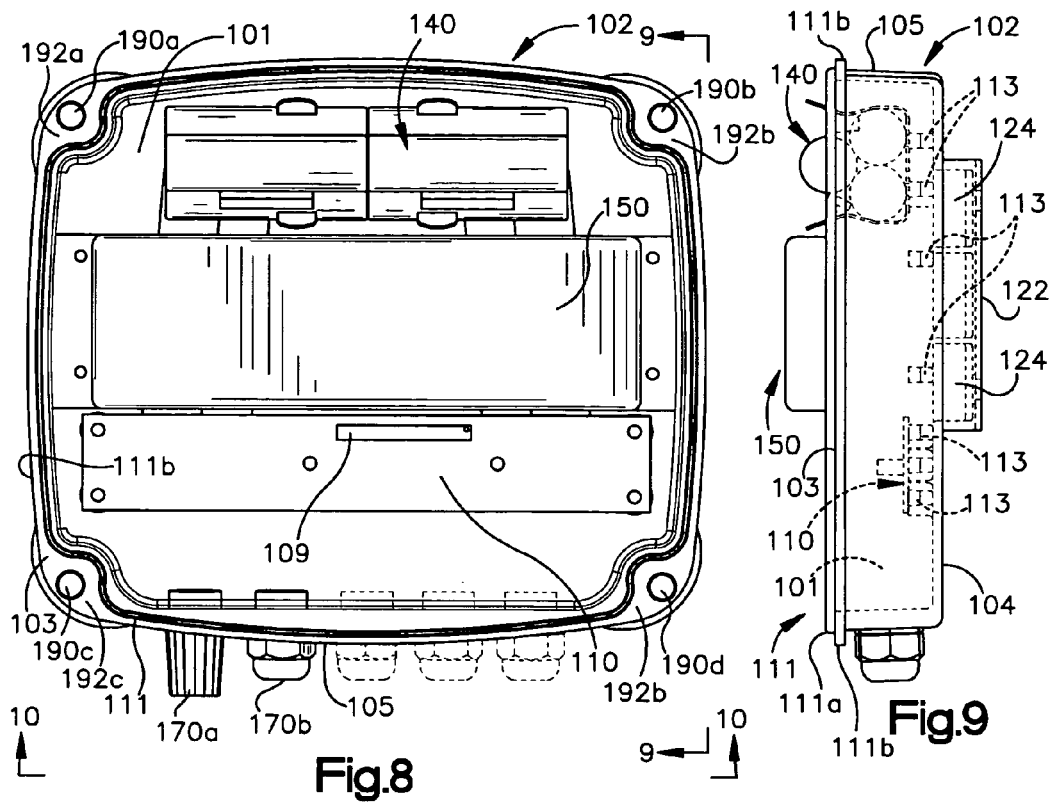
Fig.8
Fig.9
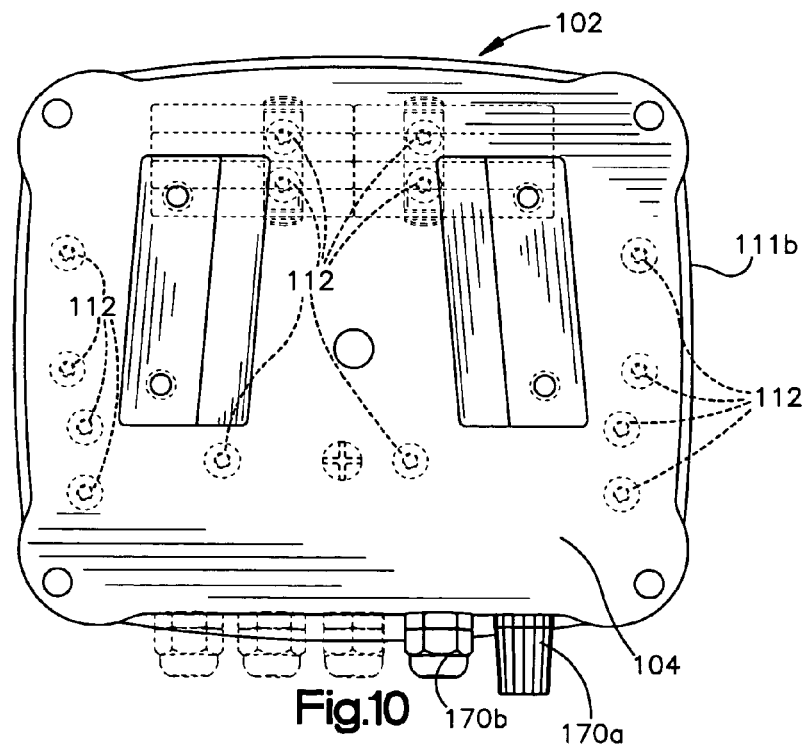
Fig.10

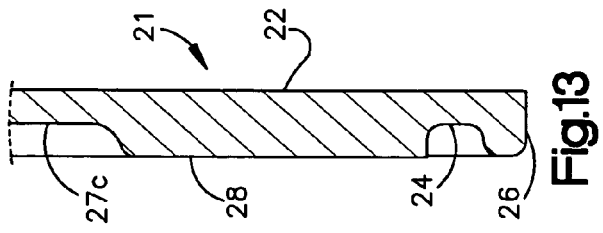
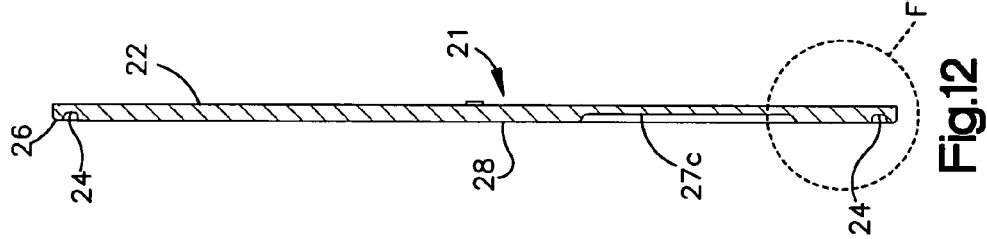
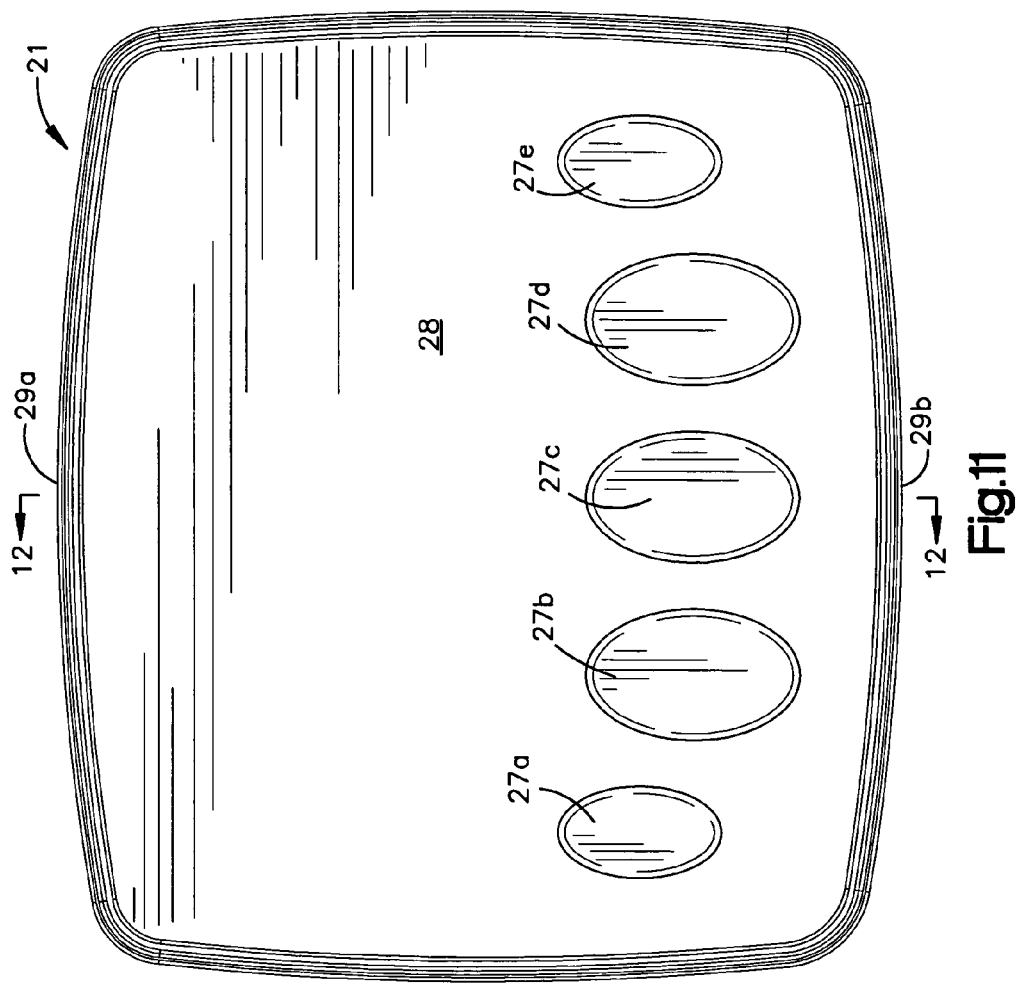

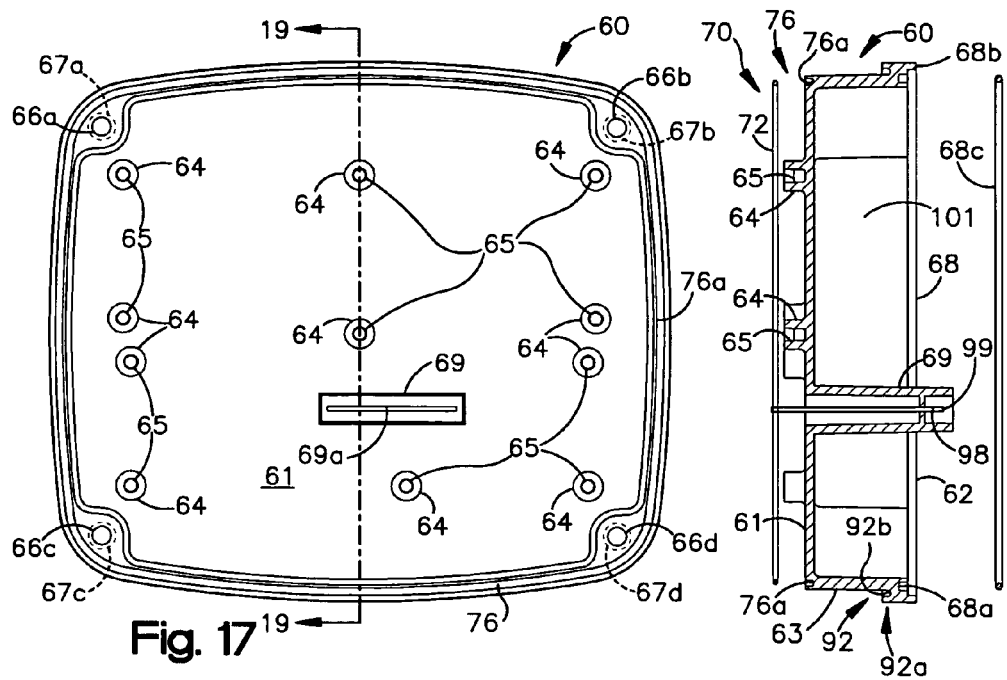
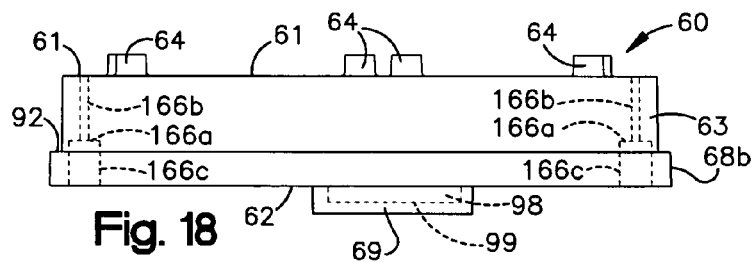
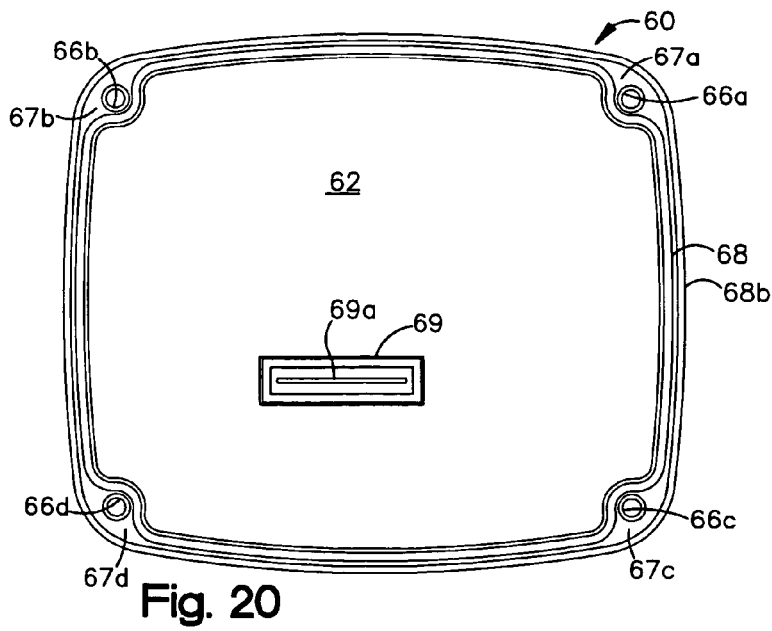

HOUSING FOR SCALE OR LOAD CELL CONTROLLER

TECHNICAL FIELD

The present invention relates generally to the field of industrial scales and load cells and, more specifically, to a moisture-resistant housing for an industrial scale or load cell controller suitable for use in hostile environments.

BACKGROUND OF THE INVENTION

Industrial scales and load cells are used in a wide variety of industrial applications. Industrial scales and load cells range in size from large units for weighing pallets of products, work station scales for weighing individual product or products in a single package, to portable scales used for quality control purposes. Typically, industrial scales and load cells utilize a remote controller, comprising control electronics disposed in a housing. An electrical signal is transmitted from the scale or load cell to the controller. Among other features, the controller includes a display to display the weight of an item being weighed and one or more touch-sensitive input keys to allow the user to select between functionalities of the scale or load cell.

In hostile environments, such as meat packing plants or manufacturing and chemical processing plants, controller electronics and a display were typically disposed in a sealed stainless steel housing. Stainless steel, however, is prone to water condensation on the inside of the unit which can harm controller electronics. Additionally, if controller electronics are powered by a battery, it is necessary to be able to open the housing and access the battery. Further, electrical connections between the scale unit and the scale controller require openings in the scale controller housing to permit electrical connection between the controller and the scale unit. Thus, insuring a moisture-proof and durable seal for stainless steel scale controller housings remained a problem. One prior art approach to dealing with these problems was to encase a stainless steel controller housing in a second stainless steel or plastic housing. However, this double housing approach increased both the cost of the controller and the space required by the controller housing. Further, since it is necessary to be able to reset the scale reading, it was necessary to mount a reset switch on the outer housing, which in turn was connected to a reset switch mounted on the inner housing, thereby increasing complexity and decreasing reliability. Additionally, the display would have to be read through two lenses, a first lens for the inner housing and a second lens for the second housing.

What is needed is a housing for a scale or load cell controller that provides a moisture-proof and durable seal to protect controller electronics and provides for easy access to the battery powering controller electronics. What is also needed is a scale or load cell controller housing that is user-friendly and ergonomically correct by providing an easy to read display, large, easy to use input keys and a mounting that facilitates easy cleaning and permits the housing to be pivoted to a position where the display is conveniently read by the user.

SUMMARY OF THE INVENTION

The present invention features a housing for a scale or load cell controller. The housing includes a front display unit coupled to a rear interface and mounting unit. The front display unit defines an interior region that includes a display and a plurality of input keys as well as controller circuitry. The front display unit includes a front and back housing and advantageously includes two mechanical seals between the front and back housings for added protection from moisture and contaminants. To facilitate repair and/or replacement of circuitry in the front display unit interior region, the front housing is removable from the back housing.

Additionally, the front display unit is removably attachable to the rear interface and mounting unit. The rear interface and mounting unit includes a rear enclosure defining a recessed area that supports a battery pack, a removable power supply and an interface circuit board. The front display unit and the rear enclosure of the rear interface and mounting unit are adapted to be removably mounted to a pivotal mounting fixture. The mounting fixture is adapted to be mounted on a horizontal or vertical surface or on a post. The mounting fixture permits the front display unit to pivot with respect to two orthogonal axes.

These and other objects, advantages, and features of the exemplary embodiment of the invention are described in detail in conjunction with the accompanying drawings.

BRIEF DESCRIPTION OF THE DRAWINGS

FIG. 5 is a front elevation view of a front display unit of FIG. 4;

FIG. 6 is a bottom plan view of the front display unit of FIG. 4

FIG. 7 is a side elevation view of the front display unit of FIG. 4;

FIG. 8 is a front elevation view of a rear enclosure of a rear interface and mounting unit of the housing of FIG. 1;

FIG. 9 is a side elevation view of the rear enclosure of FIG. 8 as seen from a plane indicated by the line 9-9 in FIG. 8;

FIG. 10 is a rear elevation view of the rear enclosure of FIG. 8 as seen from a plane indicated by the line 10-10 in FIG. 8;

FIG. 11 is front elevation view of a lens of the front display unit of FIG. 4;

FIG. 12 is a sectional view of the lens of FIG. 11 as seen from a plane indicated by the line 12-12 in FIG. 11;

FIG. 13 is an enlarged section view of a portion of the lens of FIG. 11 indicated by the circled portion labeled FIG. 13 in FIG. 12;

FIG. 17 is a front elevation view of a back housing of the front display unit of FIG. 4;

FIG. 18 is a bottom plan view of the back housing of FIG. 17;

FIG. 19 is a sectional view of the back housing of FIG. 17 as seen from a plane indicated by the line 19-19 in FIG. 17;

FIG. 20 is a rear elevation view of the back housing of FIG. 17;

DETAILED DESCRIPTION OF THE PREFERRED EMBODIMENT

Figure 1:
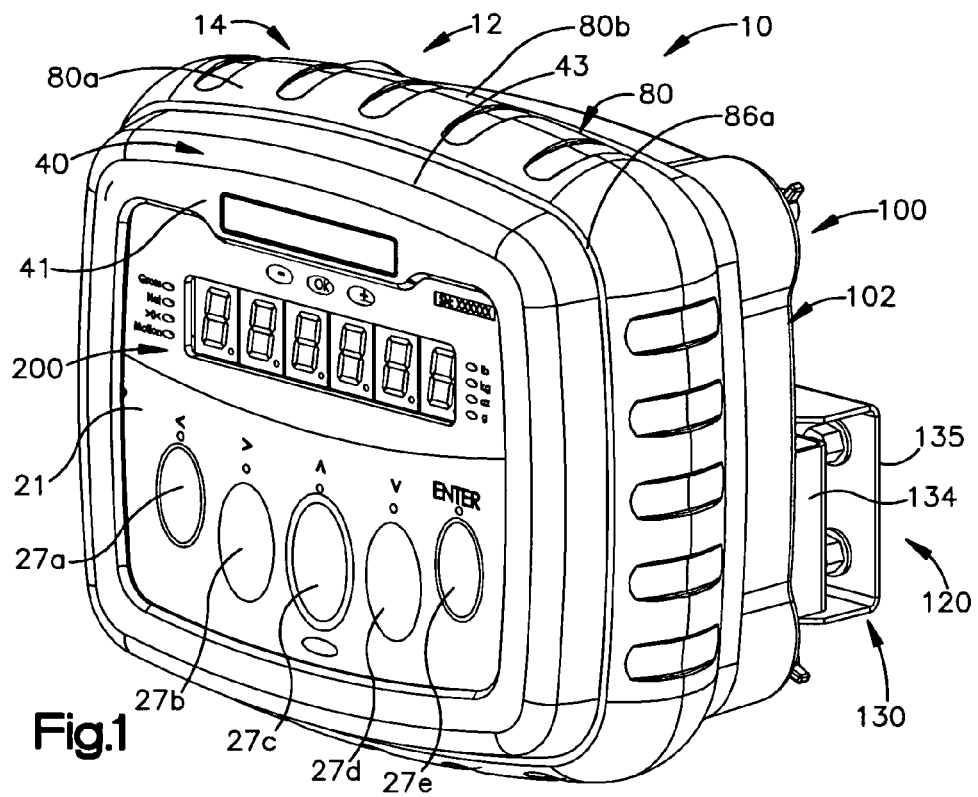
FIG. 1 is a front perspective view of a scale or load cell controller of the present invention having a housing suitable for harsh environments.

FIGS. 1-4 illustrate a controller generally at 10 suitable for use with an industrial scale or load cell (not shown). Electrical connections between the scale or load cell permit the controller 10 to receive electrical signals from a scale or load cell indicative of the weight of an item placed on the scale or load cell. The controller 10 converts the electrical signals to a weight of the item and displays the weight on a visual display of the controller. Moreover, the controller 10 includes circuitry, some of which is schematically shown in the drawings, for performing other functions selected by a user such as, for example, subtracting the tare weight or weight of a container from an item being weighed such that the displayed weight for the item is the item's net weight, displaying an item's weight in either pounds or kilograms, energizing an indicator light when an item's weight exceeds a preprogrammed weight limit, etc.

In addition, the controller 10 includes five user input keys 212a-e to allow a user to interact with the controller 10 via input of directions and/or select among the functionalities of the controller 10. Also, the controller 10 may also be electrically coupled to other remote devices such as a printer (not shown) to permit a label to be printed for the item after the weight of the item is determined to be within an acceptable range, a thermocouple (not shown) to allow the temperature of an item to be determined in addition to the item's weight, a computer to download data from the controller to a database or upload data and/or programming files from the computer and/or an external power source to recharge the internal battery pack of the controller 10.

The controller 10 of the present invention is encased in a novel controller housing 12 that is suitable for use in harsh environments such as in meat packing plants, manufacturing facilities and chemical processing plants. The housing 12 comprises a front display unit 14 and a rear interface and mounting unit 100. The front display unit 14, comprising a front housing 40 and a back housing 60, may advantageously be opened for access to electronics disposed within an interior region 15 of the front display unit 14. The front and back housings 40, 60 are secured by four threaded fasteners 16a-d, which may be removed to provide access to the interior region 15. The front display unit 14 advantageously includes a double mechanical seal to protect against ingress of moisture or other contaminants into the front display unit interior region 15.

Additionally, four captive threaded fasteners 180a-d secure the front display unit 14 to the rear interface and mounting unit 100. Advantageously, the captive threaded fasteners 180a-d thread into threaded openings formed in the fasteners 16a-d. Unthreading the four captive fasteners 180a-d permits access to electronics disposed in an interior region 101 defined by the rear interface and mounting unit 100 and the back housing 60 of the front display unit 14.

A light-emitting diode (LED) display 200 including six LEDs 202a-f, a user input keyboard 210 including five touch-sensitive user input keys 212a-e and a majority of the controller electronics are supported within the moisture-resistant interior region 15 of the front display unit 14.

A rechargeable battery pack 140 and a power supply 150 for supplying regulated power to the controller electronics are supported by the rear interface and mounting unit 100. Additionally, interface circuitry mounted on an interface circuit board 110 of the controller 10 is housed in the interior region 101 of the rear interface and mounting unit 100. Two strain-relief, water-tight fittings or connectors 170a, 170b are disposed in openings in the rear interface and mounting unit 100 to facilitate electrical connections between the controller 10 and an external power supply and a scale or load cell that the controller 10 is displaying data from. Up to five connectors may be supported in the rear interface and mounting unit to facilitate additional electrical connections such as additional scales or load cells, a printer, a thermocouple, a computer, etc.

The rear interface and mounting unit 100 advantageously includes a mounting assembly 120 that permits the controller housing 12 to be mounted to a horizontal surface, a vertical surface or a vertical or horizontal post and allows the front display unit 14 to be pivoted horizontally and vertically with respect to a mounting surface so that a user will have a clear view of the LED visual display 200 regardless of the housing's mounting position.

Front Display Unit

As can be best be seen in FIGS. 1-7, the front display unit 14 includes a clear lens 21, a label 30 with printed indicia affixed to a back surface 22 of the lens 21, the front housing 40, the back housing 60 and the frame 80.

A unique double seal system is provided between the front and back housings 40, 60. A first water resistant seal 70 is provided by a low closure force seal 72 such as a hollow tube (hereafter "tubular seal") that is compressed or sandwiched between mating surfaces 74, 76 when the front and back housings 40, 60 are assembled. An appropriate tubular seal may be obtained from Parker Hannifin Corporation, JBL Division, Spartansburg, S.C. (www.parker.com/jbl). A second water resistant seal 82 is provided by the frame 80, which overlies a boundary or seal region (i.e., the first seal 70) between the front and back housings 40, 60. The second water resistant seal 82 is provided by a first tubular seal 84 sandwiched between mating surface 86 of the front housing 40 and mating surface 88 of the frame 80 and a second tubular seal 90 sandwiched between mating surface 92 of the back housing 60 and mating surface 94 of the frame 80 when the housings 40, 60 are assembled. The double seal system provides protection from moisture and other contaminants for controller electronics disposed in the interior region 15 defined by the front display unit 14.

Advantageously, the front and rear housings 40, 60 and the frame 80 are comprised of a polycarbonate/acrylic composite material which is impact resistant, structurally stable under temperature extremes, and resistant to chemicals such as those that are common to the meat packing facilities. The lens 21 preferably is comprised of clear polycarbonate.

As can best be seen in FIGS. 3 and 11-16, the front housing 40 defines a front surface 41 and a back surface 42 spaced apart by a side wall 43. The front surface 41 includes an opening 44 through which the lens 21 is viewed. The lens 21 includes a groove 24 around its peripheral edge 26. The groove 24 engages a raised lip 46 on a back side 47 of the front surface 41 of the front housing 40. The lens 21 is adhesively affixed to the back side 47 of the front housing 40 using a suitable adhesive, the groove 24 and lip 46 creating a labyrinth effect for additional sealing strength. Alternately, other means of attachment of the lens 21 and the front housing 40, such as ultrasonic welding, known to those of skill in the art could be utilized to attach the lens to the front housing such that a moisture-proof seal between the lens and the front housing is formed. The lens 21 (FIGS. 11-13) includes five oval-shaped recesses 27a-e (FIGS. 4 and 1) in a front surface 28 of the lens 21. The recesses 27a-e are aligned with the five user input keys 212a-e to facilitate proper tactile feel when using the input keys 212a-e.

Figure 4:
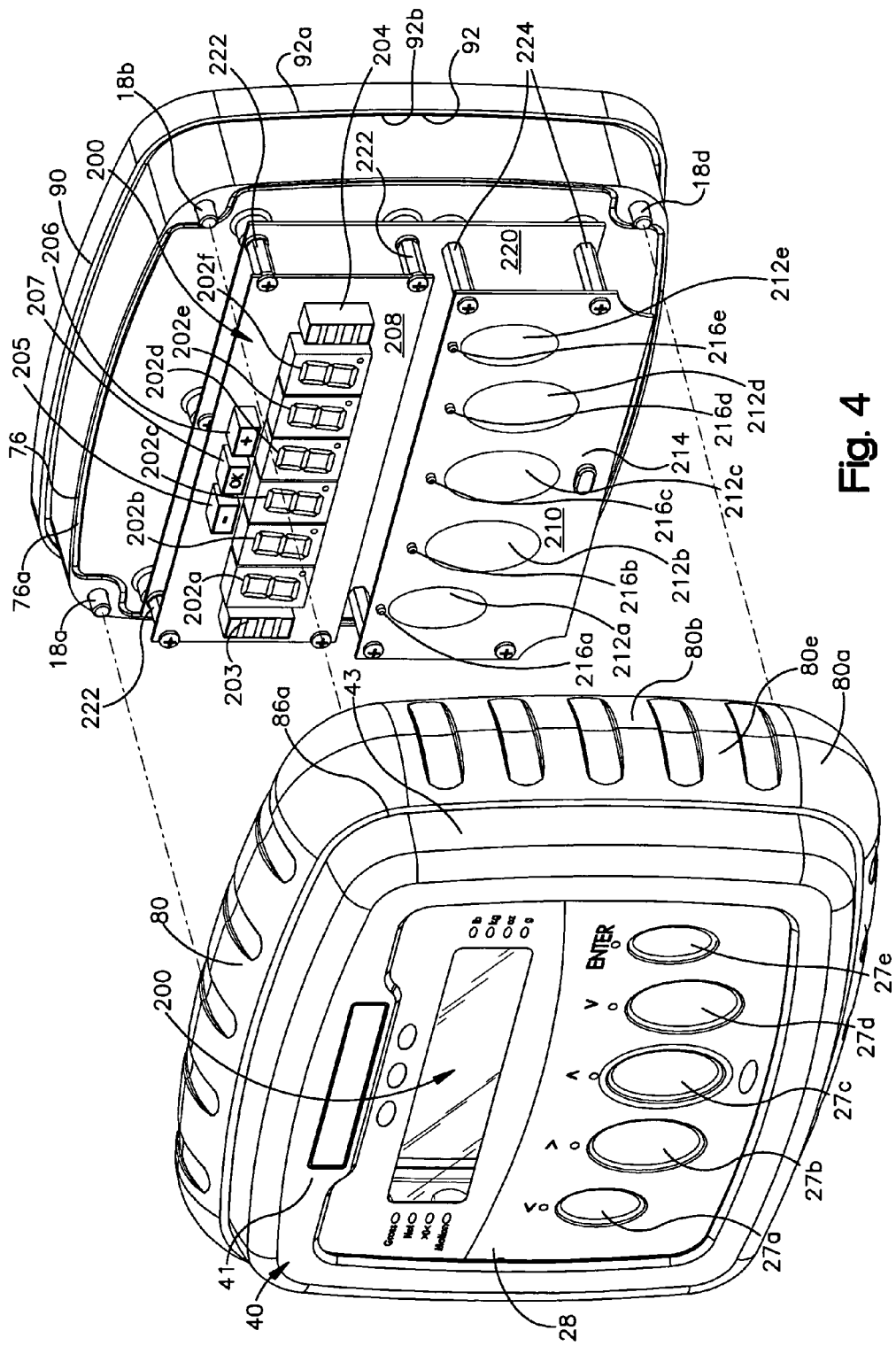
FIG. 4 is an exploded perspective view of a front display unit of the housing of FIG. 1.
Figure 14:
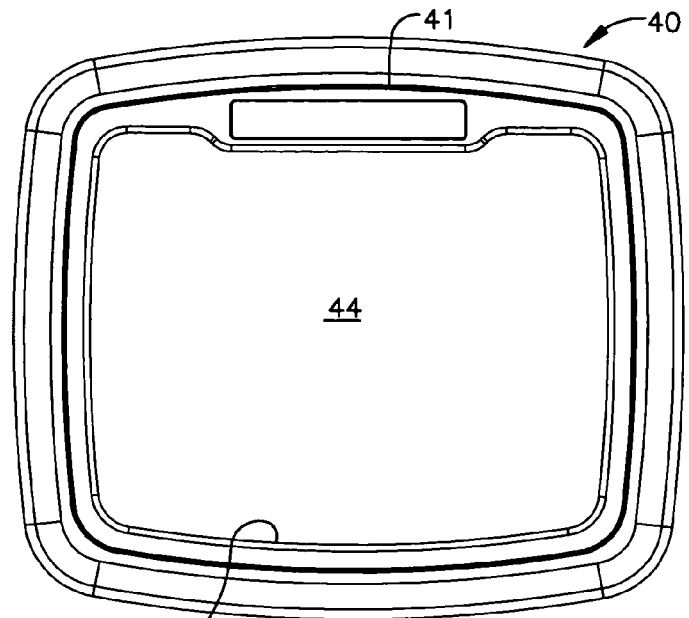
FIG. 14 is a front elevation view of a front housing or bezel of the front display unit of FIG. 4.
Figure 15:
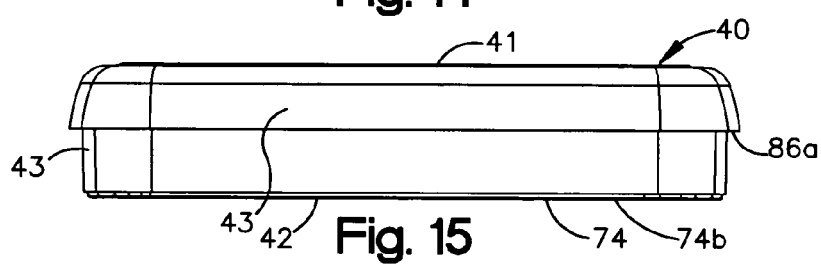
FIG. 15 is a bottom plan view of the front housing of FIG. 14.
Figure 16:
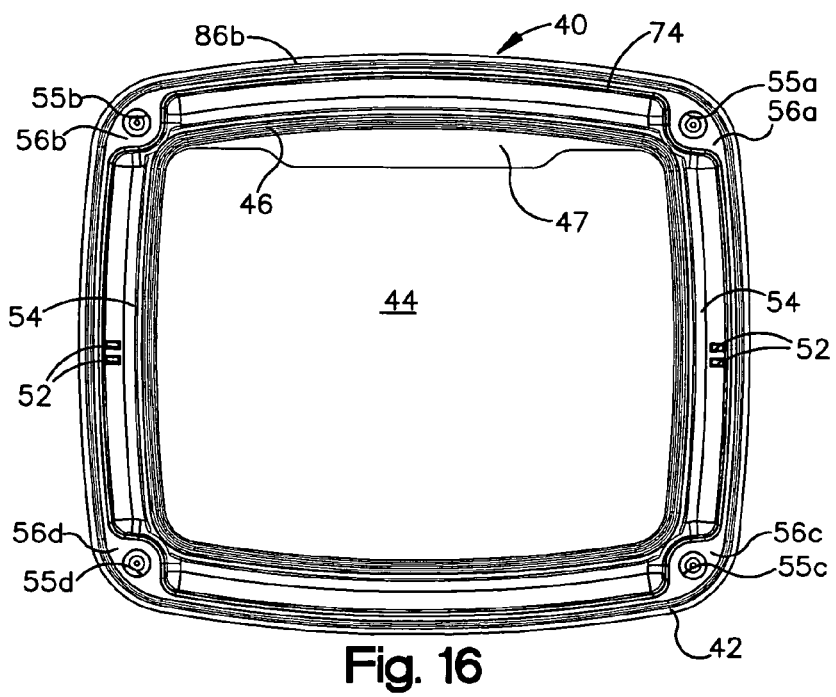
FIG. 16 is a rear elevation view of the front housing of FIG. 14.
Figure 21:
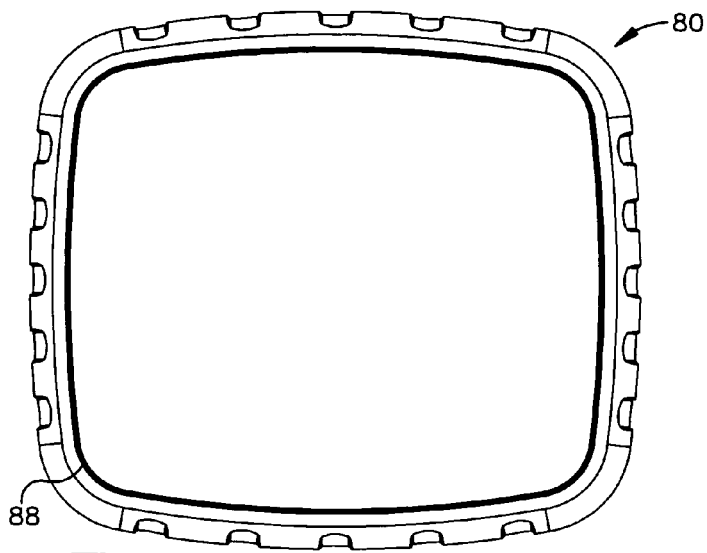
FIG. 21 is a front elevation view of one of the mating pieces that comprise the frame of the front display unit of FIG. 4.

The back housing 60 (FIGS. 17-20) includes a front surface 61, a back surface 62 and a side wall 63 spacing apart the front and back surfaces 61, 62. The front surface 61 of the back housing 60 includes eleven raised bosses 64, each having a threaded insert 65 (best seen in FIG. 17). As can best be seen in FIG. 4, the bosses 64 provide a support base for a circuit board 220 supporting controller electronics, the user input keyboard 210 including the five input keys 212a-e and the LED display 200 including the six seven segment display LEDs 202a-f, a flanking pair of LEDs 203, 204 each having four indicator lights and an additional set of three indicator lights 205, 206, 207 showing whether the weight of an item is under, over or within a predetermined range. As can be seen in FIG. 4, the LEDs and indicator lights are mounted to a circuit board 208. It should be recognized that the display 200 of the present invention may include additional seven segment LED displays, additional LED indicator lights, as well as other types of displays. For example, the controller 10 could advantageously include a liquid crystal display for displaying text and graphics. The large size of the lens 21 facilitates additional displays and such additional displays are contemplated by and within the scope of the present invention.

A lens support member 225 (FIG. 3) is supported by the front housing 40 to support the lens 21 and protect the LED display 200, the input keyboard 210 and controller electronics from damage if the lens 21 is deflected inwardly. A flat head 227 of the support member 225 bears against a back of the label 30 thereby supporting the lens 21 horizontally along its full width approximately midway between a top 29a and a bottom 29b (FIG. 11) of the lens 21. End portions 229 (only one of which can be seen in FIG. 3) of the support member 225 extend horizontally beyond the flat head 227 which contacts the lens 21 and are secured between respective pairs of spaced apart ribs 52 (best seen in FIGS. 5, 7 & 16) formed on an inner surface 54 of the side wall 43 of the front housing 40.

The end portions 229 of the support member 225 are affixed to the ribs 52 by suitable adhesive. Advantageously, the lens 21 is supported along its width in the central region of the lens where deflection would normally be expected to be the greatest and just above the recesses 27a-e in the lens 21 where users will necessarily push on the lens when using the user input keys 212a-e. Instead of being glued to the lens 21, the controller circuitry, the LED display circuit board 208 and the user input keyboard 210 are mounted to the back housing 60 providing additional protection for these electronics.

In addition to the input keys 212a-e, the input keyboard 210 also supports an infrared sensor or detector 214 and five indicator lights 216a-e, one above each input key 212a-e. As can be seen in FIG. 4, the LED board 208 and the input board 210 are spaced from the circuit board 220 by spacers 222, 224 respectively. Threaded fasteners (not shown) extend through respective spacers 222, 224 to affix the LED board 208 and the input board 210 to bosses 64 on the front surface 61 of the back housing 60.

Assembly of Front and Back Housings

The back surface 42 of the front housing 40 includes four threaded inserts 55a-d. The threaded inserts 55a-d are supported in respective bosses 56a-d extending forwardly from the back surface 42. Four stepped throughbores 66a-d extend through bosses 67a-d in the back housing 60. The bosses 67a-d extend from the front surface 61 to the back surface 62 of the back housing 60 and, when the front and back housings 40, 60 are aligned, the throughbores 66a-d are aligned with the threaded inserts 55a-d.

To assemble the front and back housings 40, 60, the frame 80 is placed over the back housing 60 such that the mating surface 92 of the back housing 60 and the mating surface 94 of the frame 80 contact the tubular seal 90. The front housing 40 is placed over the frame 80 such that the mating surface 86 of the front housing 40 and the mating surface 88 of the frame 80 contact the tubular seal 84. Four stepped threaded fasteners 16a-d (only 16a, 16b, and 16d can be seen in the drawings) are inserted into respective stepped throughbores 66a-d and are threaded into the threaded inserts 55a-d of the front housing 40.

Figure 28:
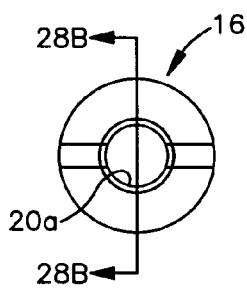
FIG. 28 is a top plan view of a fastener used to removably affix the front and back housings of the front display unit.
Figure 29:
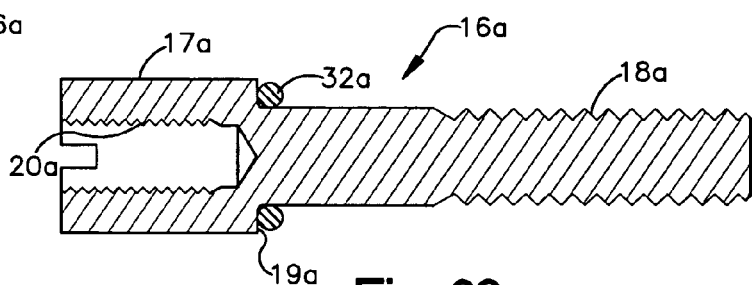
FIG. 29 is a sectional view of the fastener of FIG. 28 as seen from a plane indicated by the line 29-29 in FIG. 28.

A representative threaded fastener 16a is shown in FIGS. 28 and 29. The threaded fastener 16a includes an increased diameter head portion 17a and reduced diameter threaded portion 18a. The head portion 17a includes a slot (seen in FIG. 28) to allow the fastener 16a to be driven by a conventional screwdriver. The differing diameters between the head and threaded portions 17a, 18a define a shoulder 19a.

The throughbores 66a-d also have shoulders 166a (best seen in FIG. 18) defined by the edge between differing diameter portions 166b, 166c of the respective throughbores. The shoulders of the fasteners 16a-d bear against the throughbore shoulders 166a as the threaded portions 18a-d of the fasteners 16a-d are threaded into respective inserts 55a-d to bring the front and back housings 40, 60 and the frame 80 trapped therebetween into sealing engagement. For additional sealing around the throughbores 66a-d, o-rings (one o-ring 32a is shown in FIG. 29) are positioned on the threaded portions 18a-d of the fasteners 16a-d. As the fasteners 16a-d are threaded into the inserts 55a-d, the respective o-rings 32a are compressed between the fastener shoulders 19a and the throughbore shoulders 166a providing additional sealing against water and contaminants leaking into the front display unit interior 15.

First and Second Water Resistant Seals of Front and Back Housings

Figure 27:
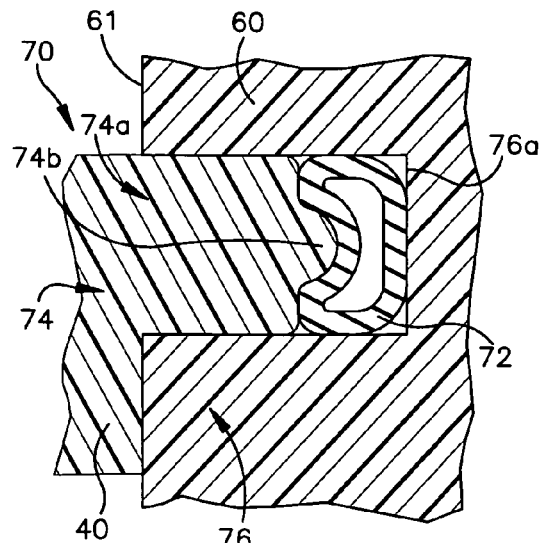
FIG. 27 is a sectional view of a seal formed by engagement surfaces of the front and back housing pieces and a tubular seal compressed between the engagement surfaces when the front and back housing pieces are assembled.

As mentioned above, the first water resistant seal 70 comprises the tubular seal 72 compressed between the mating surfaces 74, 76 of the front and back housings 40, 60 respectively. As can best be seen in FIG. 27, the tubular seal 72 is hollow for greater deformability under compression from the mating surfaces 74, 76. The mating surface 76 of the back housing 60 comprises a groove 76a formed in the front surface 61 of the back housing. The groove 76a supports the tubular seal 72. The mating surface 74 of the front housing 40 comprises a raised shoulder 74a extending rearwardly from the back surface 42 of the front housing. When the front and back housings 40, 60 are assembled, i.e., the fasteners 16a-d are tightened, the shoulder 74a bears against and compresses the tubular seal 72 to form a seal. The shoulder 74a includes a rearwardly protruding rounded head 74b that pushes into the tubular seal 72, as can be seen in FIG. 27. Advantageously, the deformation of the hollow tubular seal 72 caused by the protruding head 74b creates a labyrinth seal between the front housing 40 and the tubular seal 72 and increases the total area of contact between the tubular seal 72 and the front and back housings 40, 60, both of which improve the strength of the seal 70 between the front and back housings 40, 60.

The second moisture-resistant seal 82 overlies the first seal 70 and comprises two spaced apart moisture-resistant seals at opposite ends of the frame 80. The second seal 82 includes a front seal 82a (FIGS. 3, 6 and 7) between the front housing 40 and the frame 80 and a back seal 82b between the back housing 60 and the frame 80.

Figure 26:
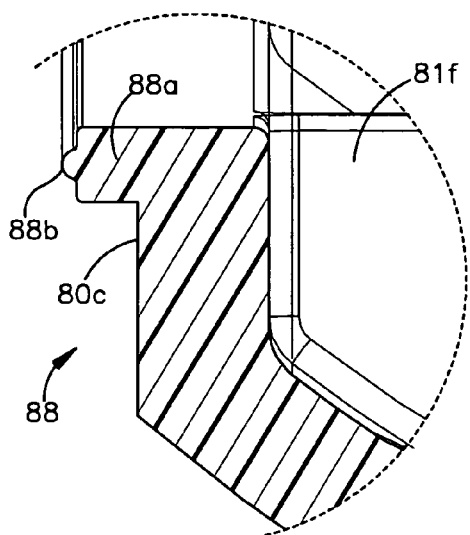
FIG. 26 is an enlarged sectional view of a portion of the frame piece of FIG. 21 as indicated by the circled portion labeled FIG. 26 in FIG. 25.

The front seal 82a includes the first hollow tubular seal 84 compressed between the mating surfaces 86, 88 of the front housing 40 and the frame 80 and a second hollow tubular seal 90 compressed between the mating surfaces 92, 94 of the back housing and the frame 80. The mating surface 86 of the front housing 40, best seen in FIGS. 15 & 16, comprises a stepped region 86a in the side wall 43 forming a rearwardly facing groove 86b. The tubular seal 84 fits into the groove 86b. As best seen in FIG. 26, the mating surface 88 of the frame includes a raised shoulder 88a extending forwardly from a front surface 80c of the frame 80. The raised shoulder 88a further includes a forwardly protruding rounded head 88b. When the front and back housings 40, 60, with the frame 80 trapped therebetween, are assembled by tightening the fasteners 16a-d, the mating surface 88 of the frame 80 bears against and compresses the tubular seal 84 to form a labyrinth seal in the same way as described with respect to the first seal 70 between the front and back housings 40, 60.

Similarly, as best seen in FIG. 19, the mating surface 92 of the back housing 60 comprises a stepped region 92a in the side wall 63 forming a forwardly facing groove 92b. The tubular seal 90 fits into the groove 92b. The mating surface 94 of the frame 80 is the same structurally as the mating surface 88 of the frame, since the frame pieces or bumpers 80a, 80b, as will be explained below, are identical. The mating surface 94 of the frame 80 includes a raised shoulder extending rearwardly from a back surface 80d of the frame 80. The raised shoulder further includes a rearwardly protruding rounded head. When the front and back housings 40, 60, with the frame 80 trapped therebetween, are assembled by tightening the fasteners 16a-d, the mating surface 94 of the frame 80 bears against and compresses the tubular seal 90 to form a labyrinth seal in the same way as described with respect to the first seal 70 between the front and back housings 40, 60.

Figure 22:
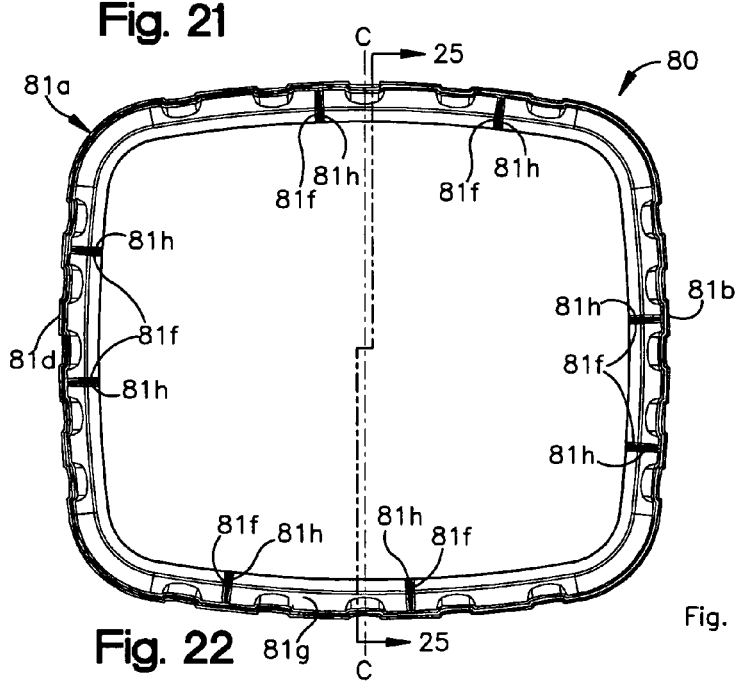
FIG. 22 is a rear elevation view of the frame piece of FIG. 21.
Figure 25:
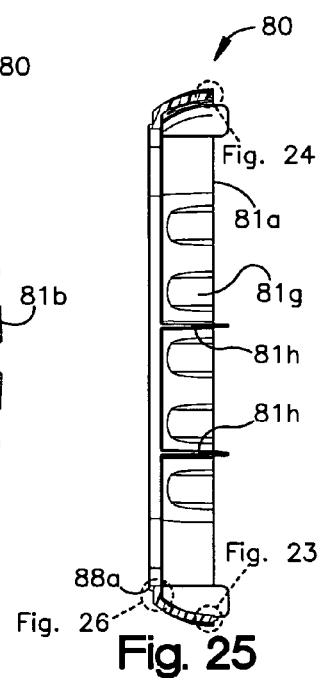
FIG. 25 is a sectional view of the frame piece of FIG. 21 as seen from a plane indicated by the line 25-25 in FIG. 22.
Figure 23:
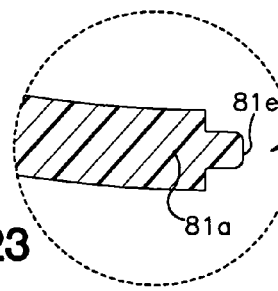
FIG. 23 is an enlarged sectional view of a portion of the frame piece of FIG. 21 as indicated by the circled portion labeled FIG. 23 in FIG. 25.
Figure 24:
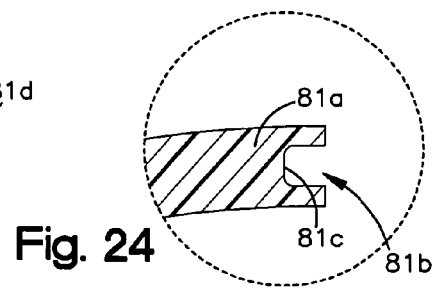
FIG. 24 is an enlarged sectional view of a portion of the frame piece of FIG. 21 as indicated by the circled portion labeled FIG. 24 in FIG. 25.

The frame 80 comprises the identical pair of pieces or bumpers 80a, 80b having a tongue and groove engagement and which are permanently sealed utilizing an adhesive or other means such as ultrasonic welding. As can best be seen in FIGS. 21-25, a peripheral engagement surface 81a of the bumper 80a (and similarly the identical bumper 80b) is split into two halves, that is, looking at FIG. 22, one half of the engagement surface is disposed to the left of center line C-C and the other half of the engagement surface is disposed to the right of center line C-C. The right half 81b of the engagement surface 81a includes a rectangular groove 81c (shown in FIG. 24) and the left half 81d of the engagement surface 81a includes an upward extending rectangular rib 81e (shown in FIG. 23).

When the two bumpers 80a, 80b are assembled a layer of adhesive is applied to the mating engagement surfaces 81b, 81d and the two bumpers 80a, 80b are pressed together. The rectangular rib 81e of the bumper 80a engages and seals against the rectangular groove 81c of the bumper 80b and the rectangular rib 81e of the bumper 80b engages and seals against the rectangular groove 81c of the bumper 80a.

Each of the bumpers 80a, 80b includes a series of eight ribs 81f extending inwardly from a side wall 81g of the respective bumpers. The ribs 81f are configured to overlap the respective engagement surfaces 81a. The ribs 81f provide for easy and proper alignment of the frame engagement surfaces 81a, that is, the alignment of left side engagement surface 81b of the bumper 80a with the right side engagement surface 81d of the bumper 80b and the alignment of right side engagement surface 81d of the bumper 80a with the left side engagement surface 81b of the bumper 80b.

When the front display unit 14 is assembled, interior edges 81h of the sixteen ribs 81f bear against the outer surfaces of the side walls 43, 63 of the front and back housings 40, 60. Additionally, four frame inserts 96 are disposed along a side wall 80e of the frame 80 and bear against the outer surfaces of the side walls 43, 63 of the front and back housings 40, 60. The sixteen ribs 81f and four frame inserts 96 minimize any inward bowing of the side walls 81g of the bumpers 80a, 80b which may compromise or weaken the strength of the second seal 82 between the frame 80 and the front and back housings 40, 60. A clearance space exists between the frame 80 and the outer surfaces of the side walls 43, 63 of the front and back housings 40, 60 overlaid by the frame. If desired, the clearance space may be used to house a flexible antenna (not shown), which would be weaved around one or more of the ribs 81f and/or through openings in one or more of the inserts 96.

Rear Interface and Mounting Unit

Figure 30:
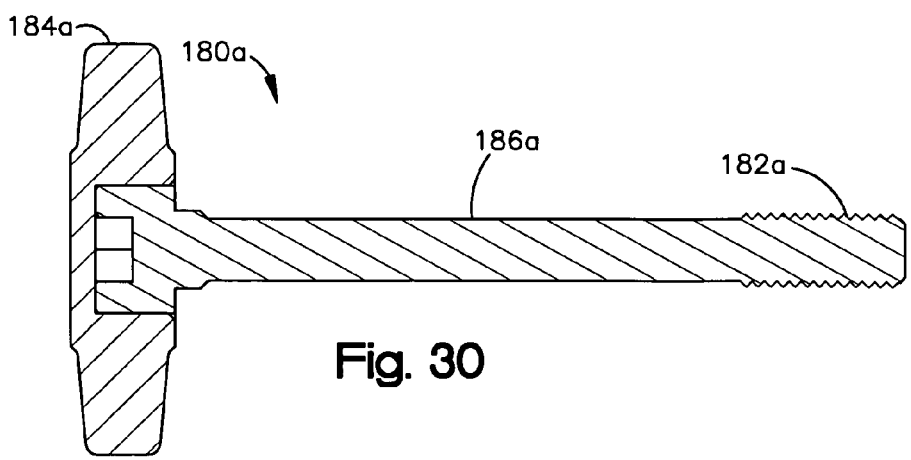
FIG. 30 is a sectional view of a fastener used to removably affix the front display unit to the rear enclosure.

The rear interface and mounting unit 100 (shown generally in FIGS. 1-3) includes the rear enclosure 102 and a mounting assembly 120. Like the front and rear housings 40, 60, the rear enclosure 102 is comprised of a polycarbonate/acrylic composite material. The rear enclosure 102 includes a front surface 103 and a back surface 104 spaced apart by a side wall 105. The front display unit 14 is affixed to the rear enclosure 102 of the rear interface and mounting unit 100 using the four captive fasteners 180a-d. One representative fastener 180a is shown in detail in FIG. 30. The fastener 180a include a distal threaded portion 182a, an enlarged head portion 184a and a reduced diameter unthreaded portion 186a extending between the threaded portion 182a and the head portion 184a.

The fasteners 180a-d are held or captured in threaded inserts 190a-d extending between a front and back side of the rear enclosure 102. The inserts 190a-d are supported in side wall corner bosses 192a-d of the rear enclosure 102. To insert the fasteners 180a-d in the inserts 190a-d, the threaded portions 182a-d are threaded through the inserts 190a-d. The reduced diameter unthreaded portion 186a-d is then slidably captured within the inserts 190a-d.

To assemble the front display unit 14 to the rear enclosure 102, the threaded portion 182a-d of the fasteners 180a-d are threaded into the threaded openings 20a-d of the fasteners 16a-d. An engagement surface 68 of the back surface 62 of the back housing 60 includes a recess 68a (FIG. 19) that is rectangular in cross section and a rearwardly extending raised ridge 68b. The recess 68a is sized to accept a flexible tubular seal 68c (FIG. 19). The front surface 103 of the rear enclosure 102 includes an engagement surface 111 including a forwardly protruding shoulder 111a (FIG. 9). The engagement surface 111 with the forwardwardly protruding shoulder 111a is similar to the engagement surface 74 (including shoulder 74a and head 74b) of the front housing 40.

When the front display unit 14 is secured to the rear enclosure 102, the tubular seal 68c is compressed and tightly sandwiched between the respective engagement surfaces 68, 111 to provide a moisture-resistant labyrinth seal. Providing additional sealing protection, the engagement surface 111 further includes an outer periphery 111b of the front surface 103 of the rear enclosure 102. The outer periphery 111b is sized to snap fit into and firmly abut the raised ridge 68b of the engagement surface 68 of the back housing 60.

The front display unit 14 can be removed from the rear enclosure 102 to provide access to the components housed in the interior region 101 defined by the back housing 60 of the display unit 14 and the rear enclosure 102 including the battery pack 140 and the power supply 150. As can be seen in FIGS. 8 and 9, the battery pack 140, power supply 150 and the interface circuit board 110 are mounted to fourteen bosses 112 (each having a threaded insert 113) extending into the interior region 101 from the back surface 104 of the rear enclosure 102.

Electrical Connection Between Front Housing Unit Electronics and Rear Enclosure Electronics Electrical connection is provided between the circuitry disposed in the interior region 15 of the front housing unit 14 and circuitry disposed in an interior region 101 of the rear enclosure 102 via engagement of an edge connector printed circuit card 98 and an edge connector card receiving socket 109 of an interface circuit board 110 of the rear enclosure 102 when the front housing unit 14 is affixed to the rear enclosure 102. The edge connector card 98 is supported in a rearwardly extending connector support 69 (best seen in FIGS. 17-20) of the back housing 60. To support and seal the edge connector card 98 with the support 69, the support is filled with sealing compound. An edge or interface portion 99 of the card 98 extends through an opening 69a in the support 69. When the front display unit 14 is affixed to the rear enclosure 102, the electrical connections of the edge portion of the interface card 98 accurately and precisely mate with the electrical connections of the edge connection socket 109.

Advantageously, the mechanical mating of the edge connector 98 and socket 109 is foolproof, durable and robust. The edge connector—socket electrical connection is much superior to traditional multi pin DIP connector and socket connections. The fragile, easily bent legs of a multi pin connector would require additional steps or structure (locating tabs) for extremely precise alignment of the multi pin connector and the socket when the front display unit 14 and the rear enclosure 102 are assembled. Even a slight misalignment of the connector legs and socket openings would result in bending of one or more connector legs.

External Electrical Connections

Two electrical cables or cords (not shown) are routed into the interior region 101 (FIGS. 9 and 19) and defined by space between the rear enclosure 102 and the back surface 62 of the back housing 60 via two strain-relief, water-tight fittings or connectors 170a, 170b. Depending on needs, up to five such connectors may be supported. The possibility of three additional connectors are shown in dashed line in FIGS. 8 & 10. The connectors 170a, 170b are mounted in openings in the side wall 105 of the rear enclosure 102. The connectors 170a, 170b may be of different sizes depending on the diameter of the cable or cord desired to be routed through the connectors. Appropriate connectors may be purchased from Heyco, P.O. Box 517, Toms River, N.J. 08754 as Heyco part nos. PG-9 and PG-11 or from Hubbell, 584 Derby Milford Road, Orange, Conn. 06477 as Hubbell part no. SHC10111CR. The connectors 170a-e seal tightly around the exterior of the respective cables or cords routed through them to provide a water-tight seal. The electrical cables or cords are appropriately coupled to the interface circuit board 110 or appropriate conductors of the controller power supply 150.

Mounting Assembly

The mounting assembly 120 (FIGS. 1-3) includes a mounting bracket 122 and a mounting fixture 130. The mounting bracket 122 is affixed to a pair of flanges 124 extending outwardly from the back surface 104 of the rear enclosure 102. Respective upper surfaces 126 of the pair of flanges 124 include a stepped region 128 which accepts a tapered tongue piece 131 of the mounting fixture 130. When the back enclosure 102 is mounted on the mounting fixture 130, an extending portion of the tongue piece 131 slides into an opening defined by the stepped region 128 of the pair of flanges 124 and the mounting bracket 122. The tongue piece 131 includes a slightly bent tab portion 132 disposed on its upper periphery 133 which snaps into a cut out 129 on the mounting bracket 122 to secure the mounting connection between the mounting assembly 120 and the rear enclosure 102. To remove the rear enclosure 102 from the mounting fixture tongue piece 131, the rear enclosure 102 is pulled upwardly thereby disengaging it from the tongue piece 131.

Advantageously, because of offset from the back surface 104 of the rear enclosure 102 provided by the pair of flanges 124, the mounting structure of the rear interface and mounting unit 100 facilitates easy and complete cleaning of the scale controller housing 12 by providing a rinse-through space between the mounting bracket tongue piece 131 and the back surface 104 of the rear enclosure 102.

The mounting fixture 130 includes the tongue piece 131, a tongue support member 134 that permits the tongue to pivot about a horizontal axis, a C-shaped flange 135 that supports the tongue support member 134 for pivoting about a vertical axis. Depending on how it is desired to mount the controller 10 with respect to a work surface, the mounting fixture 130 may further include an L-shaped flange 136 (only shown in FIG. 3). Specifically, if it is desired to mount the controller 10 to a vertical or near vertical work surface, a middle portion of the C-shape flange 135 includes four mounting apertures 137 (FIG. 2—shown with bolts in apertures) to permit the mounting fixture to be mounted to a vertical surface. The same mounting apertures 137 of the C-shaped flange 135 would be used if it was desired to mount the controller 10 to a vertical or near vertical post. U-shaped mounting bolts (not shown) extending through the mounting apertures would be used to mount the controller 10 to a vertical post.

Figure 2:
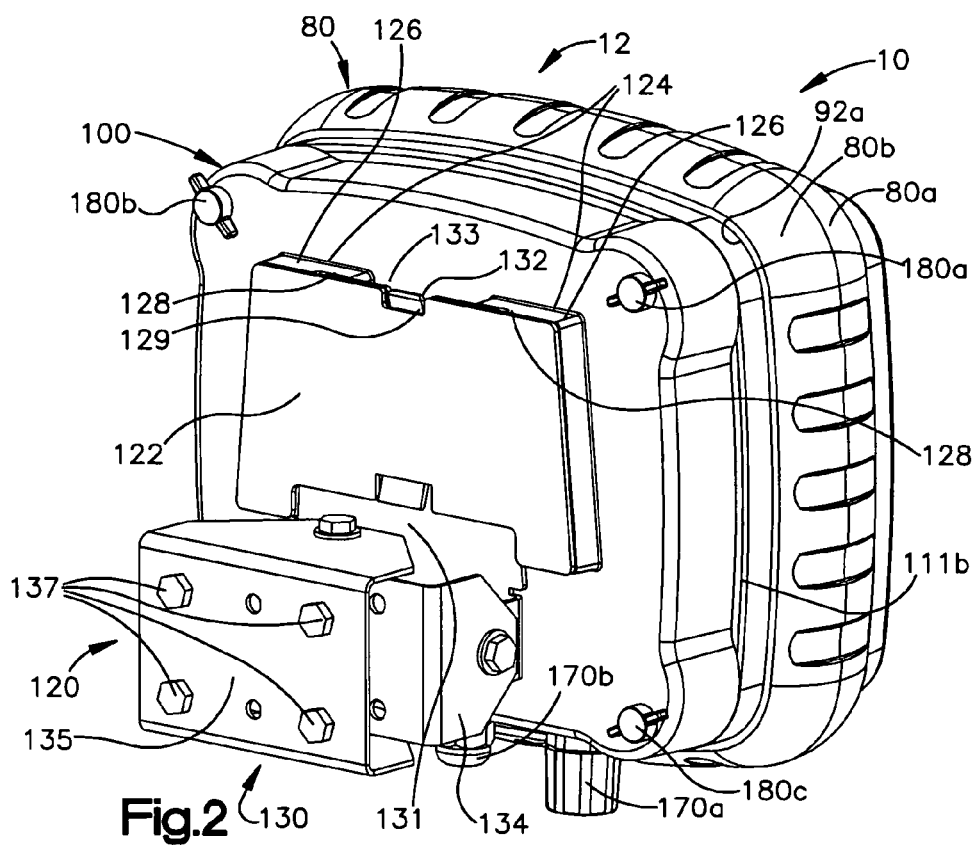
FIG. 2 is a rear perspective view of the housing of FIG. 1.
Figure 3:
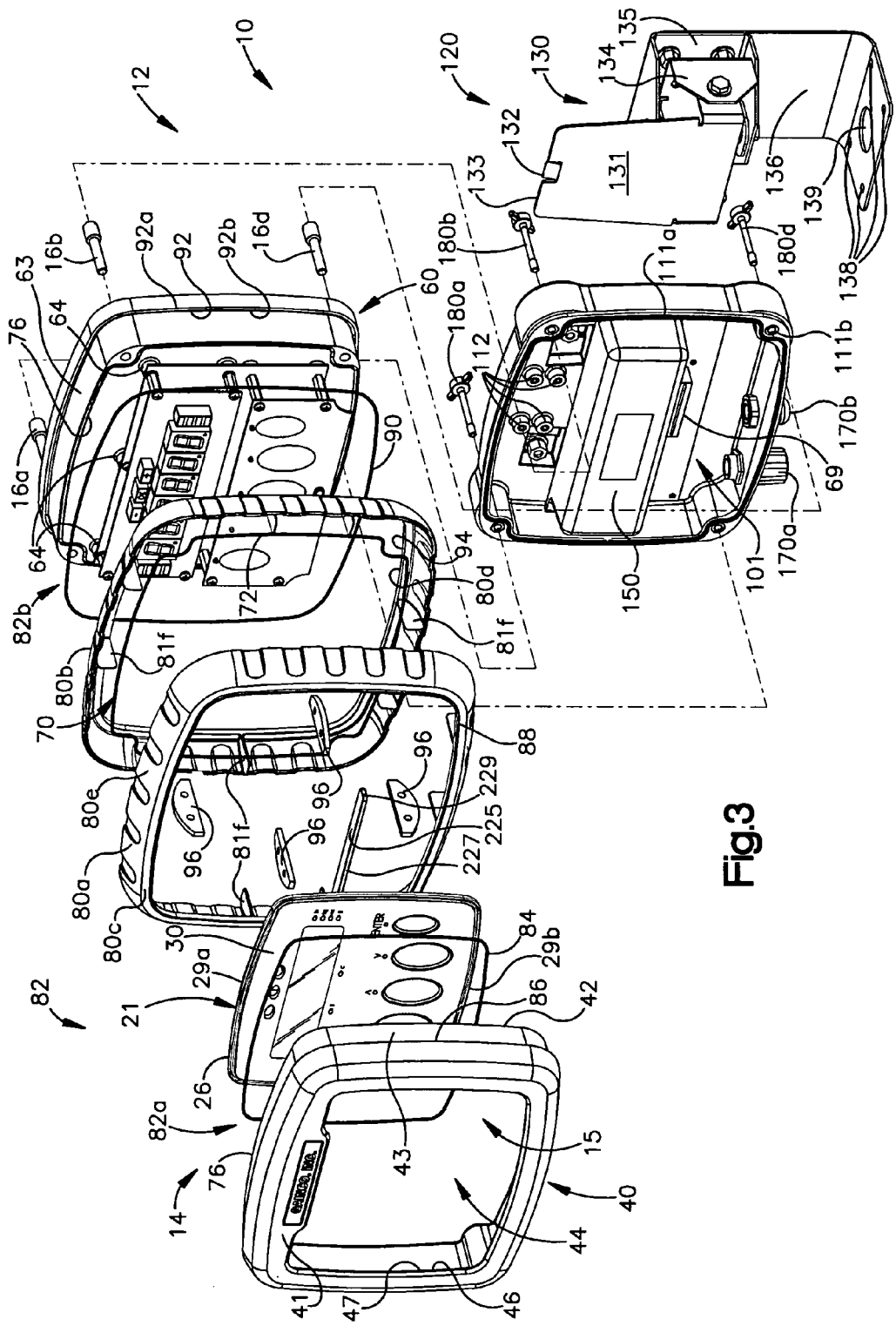
FIG. 3 is an exploded perspective view of the housing of FIG. 1 including an additional L-shaped flange of a mounting assembly.

If, on the other hand, it is desired to mount the controller 10 with respect to a horizontal or near horizontal work surface, the L-shaped flange 136 (FIG. 3) is affixed to the C-shaped flange as shown in FIGS. 2 and 3. A lower portion of the L-shaped flange 136 includes four mounting apertures 138 for mounting to a horizontal work surface. The lower portion of the L-shaped flange 136 also includes a larger opening 139 (FIG. 3) centered between the four apertures 138 for convenient routing electrical connections to the interface connectors. The same mounting apertures 138 would be used if it was desired to mount the controller 10 to a horizontal or near horizontal post. U-shaped mounting bolts (not shown)

extending through the mounting apertures 138 would be used to mount the controller 10 to a horizontal post.

Although the present invention has been described with a degree of particularity, it is the intent that the invention include all modifications and alterations from the disclosed design falling within the spirit or scope of the appended claims.

We claim:

1. A housing for a scale or load cell controller, the housing comprising: a) front display unit including a front housing, a back housing removably attached to the front housing with a first set of fasteners extending between the front and the back housings, and a lens affixed to the front housing, the front display unit defining an interior region housing controller electronics, and a frame overlying at least a portion of a boundary between the front and back housings, wherein the frame includes a first engagement surface that compresses a first low closure force seal between the frame and a frame enhancement surface of the front housing to form a front water resistant seal and a second enhancement surface that compresses a second low closure force seal between the frame and a frame enhancement surface of the back housing to form a back water resistant seal; and b) a rear interface and mounting unit removably affixed to the front display unit for mounting the housing to a surface.

2. The housing of claim 1 wherein the rear interface and mounting unit includes a rear enclosure defining a recessed area which supports a battery pack, a power supply and an interface circuit board.

3. The housing of claim 2 wherein the rear interface and mounting unit includes a mounting bracket affixed to the rear enclosure and a mounting fixture releasably engagable with the mounting bracket and adapted to be mounted on a horizontal or vertical surface or on a post.

4. The housing of claim 3 wherein the mounting fixture is pivotal along two orthogonal axes.

5. The housing of claim 1 wherein the front display unit supports a display visible through the lens and a plurality of input keys actuatable by pressing predetermined regions of the lens.

6. The housing of claim 1 wherein a third low closure force seal is compressed between respective engagement surfaces of the front and back housings to form a third water resistant seal.

7. The housing of claim 6 wherein the first low closure force seal, the second low closure force seal and the third low closure force seal are tubular seals and at least one of the respective engagement surfaces of the front and back housings includes a protruding portion that contacts the third tubular seal deforming its outer surface inwardly to form a labyrinth seal.

8. The housing of claim 6 wherein the frame overlies the third water resistant seal.

9. The housing of claim 7 wherein at least one of the first engagement surface of the frame and the frame engagement surface of the front housing includes a protruding portion that contacts the first tubular seal deforming its outer surface inwardly to form a labyrinth seal.

10. The housing of claim 7 wherein at least one of the second engagement surface of the frame and the frame engagement surface of the back housing includes a protruding portion that contacts the second tubular seal deforming its outer surface inwardly to form a labyrinth seal.

11. The housing of claim 5 wherein controller circuitry, the display, and the plurality of input keys are supported by the back housing.

12. The housing of claim 5 wherein a front surface of the lens includes recesses corresponding to the predetermined regions of the lens.

13. The housing of claim 5 wherein the front display unit includes a lens support member disposed between the lens and the front housing and extending across at least a portion of an inward facing surface of the lens to limit inward deflection of the lens when the predetermined regions of the lens are pressed to actuate the plurality of input keys.

14. The housing of claim 6 wherein at least one fastener in the first set of fasteners includes an threaded opening, the rear interface and mounting unit being removably affixed to the front display unit by a second fastener that bears against the rear interface and mounting unit and threads into the threaded opening in the at least one fastener with the threaded opening.

15. A housing for a scale or load cell controller, the housing comprising: a) front display unit including a front housing, a back housing removably affixed to the front housing with a first set of fasteners extending between the front and the back housings, a lens affixed to the front housing and a lens support member, the front display unit defining an interior region housing controller electronics and supporting a display visible through the lens and a plurality of input keys actuatable by pressing the predetermined regions of the lens, the lens support member disposed between the lens and the front housing and extending across at least a portion of an inward facing surface of the lens to limit inward deflection of the lens when the predetermined regions of the lens are pressed to actuate the plurality of input keys, a frame overlying at least a portion of a boundary between the front and back housings wherein the frame includes a first enhancement surface that compresses a first low closure force seal between the frame and a frame enhancement surface of the front housing to form a front water resistant seal and a second enhancement surface that compresses a second low closure force seal between the frame and a frame enhancement surface of the back housing to form a back water resistant seal; and b) a rear interface and mounting unit removably affixed to the front display unit for mounting the housing to a surface.

16. The housing of claim 15 wherein the lens support member is t-shaped and supported by a side wall of the front housing, a flat head portion of the lens support member bearing against the lens and extending substantially across a full width of the lens.

17. The housing of claim 15 wherein the rear interface and mounting unit includes a rear enclosure defining a recessed area which supports a battery pack, a power supply and an interface circuit board.

18. The housing of claim 17 wherein the rear interface and mounting unit includes a mounting bracket affixed to the rear enclosure and a mounting fixture releasably engagable with the mounting bracket and adapted to be mounted on a horizontal or vertical surface or on a post.

19. The housing of claim 15 wherein the display includes a light emitting diode display.

20. The housing of claim 15 wherein a third low closure force seal is compressed between respective engagement surfaces of the front and back housings to form a third water resistant seal the first low closure force seal, the second low closure force seal and the third low closure force seal being tubular seals.

21. The housing of claim 20 wherein at least one of the respective engagement surfaces of the front and back housings includes a protruding portion that contacts the third tubular seal deforming its outer surface inwardly to form a labyrinth seal.

22. The housing of claim 20 wherein the frame overlies the third water resistant seal.

23. The housing of claim 20 wherein at least one of the first engagement surface of the frame and the frame engagement surface of the front housing includes a protruding portion that contacts the first tubular seal deforming its outer surface inwardly to form a labyrinth seal.

24. The housing of claim 20 wherein at least one of the second engagement surface of the frame and the frame engagement surface of the back housing includes a protruding portion that contacts the second tubular seal deforming its outer surface inwardly to form a labyrinth seal.

25. The housing of claim 15 wherein controller circuitry, the display, and the plurality of input keys are supported by the back housing.

26. The housing of claim 15 wherein a front surface of the lens includes recesses corresponding to the predetermined regions of the lens.

27. The housing of claim 20 wherein at least one fastener in the first set of fasteners includes an threaded opening, the rear interface and mounting unit being removably affixed to the front display unit by a second fastener that bears against the rear interface and mounting unit and threads into the threaded opening in the at least one fastener with the threaded opening.

28. The housing of claim 18 wherein the mounting fixture is pivotal along two orthogonal axes.

29. A housing for a scale or load cell controller, the housing comprising: a) front display unit including a front housing, a back housing removably attached to the front housing and a lens affixed to the front housing, the front display unit defining an interior region housing controller electronics, a frame overlying at least a portion of a boundary between the front and back housings wherein the frame includes a first enhancement surface that compresses a first low closure force seal between the frame and a frame engagement surface of the front housing to form a front water resistant seal and a second engagement surface that compresses a second low closure force seal between the frame and a frame engagement surface of the back housing to form a back water resistant seal; and b) a rear interface and mounting unit removably affixed to the front display unit for mounting the housing to a surface; c) a first set of fasteners extending between the front and back housings to removably attach the front and back housings, at least one fastener in the first set of fasteners includes an threaded opening; and d) a second fastener extending between the rear interface and mounting unit and the front display unit to removably affix the rear interface and mounting unit to the front display unit, the second fastener bearing against the rear interface and mounting unit and threading into the threaded opening in the at least one fastener with the threaded opening.

30. The housing of claim 29 wherein a third low closure force seal is compressed between respective engagement surfaces of the front and back housings to form a third first water resistant seal.

31. The housing of claim 29 wherein the rear interface and mounting unit includes a rear enclosure defining a recessed area which supports a battery pack, a power supply and an interface circuit board.

32. The housing of claim 29 wherein the rear interface and mounting unit includes a mounting bracket affixed to the rear enclosure and a mounting fixture releasably engagable with the mounting bracket and adapted to be mounted on a horizontal or vertical surface or on a post.

33. The housing of claim 29 wherein the front display unit supports a display visible through the lens and a plurality of input keys actuatable by pressing predetermined regions of the lens.

34. The housing of claim 30 wherein the first low closure force seal, the second low closure force seal and the third low closure force seal are tubular seals and at least one of the respective engagement surfaces of the front and back housings includes a protruding portion that contacts the third tubular seal deforming its outer surface inwardly to form a labyrinth seal.

35. The housing of claim 34 wherein the frame overlies the third water resistant seal.

36. The housing of claim 34 wherein at least one of the first engagement surface of the frame and the frame engagement surface of the front housing includes a protruding portion that contacts the first tubular seal deforming its outer surface inwardly to form a labyrinth seal.

37. The housing of claim 34 wherein at least one of the second engagement surface of the frame and the frame engagement surface of the back housing includes a protruding portion that contacts the second tubular seal deforming its outer surface inwardly to form a labyrinth seal.

38. The housing of claim 33 wherein controller circuitry, the display, and the plurality of input keys are supported by the back housing.

39. The housing of claim 33 wherein a front surface of the lens includes recesses corresponding to the predetermined regions of the lens.

40. The housing of claim 33 wherein the front display unit includes a lens support member disposed between the lens and the front housing and extending across at least a portion of an inward facing surface of the lens to limit inward deflection of the lens when the predetermined regions of the lens are pressed to actuate the plurality of input keys.

41. The housing of claim 32 wherein the mounting fixture is pivotal along two orthogonal axes.

42. A housing for a scale or load cell controller, the housing comprising: a) front display unit including a front housing, a back housing removably attached to the front housing with a first set of fasteners extending between the front and the back housings, and a lens affixed to the front housing, the front display unit defining an interior region housing controller electronics and having a water resistant seal between the front and back housings, the controller electronics including a edge connector circuit card extending through an opening in the back housing, a frame overlying at least a portion of a boundary between the front and back housings wherein the frame includes a first engagement surface that compresses a first low closure force seal between the frame and a frame enhancement surface of the front housing to form a front water resistant seal and a second engagement surface that compresses a second low closure force seal between the frame and a frame engagement surface of the back housing to form a back water resistant seal; b) a rear interface and mounting unit removably affixed to the back housing of the front display unit for mounting the housing to a surface, the rear interface and mounting unit supporting electronic circuitry including an interface circuit board having an edge connector socket adapted to receive a mating portion of the edge connector circuit card; and c) the edge connector portion of the edge connector circuit card being received in the edge connector socket when the rear interface and mounting unit is affixed to the front display unit to provide for electrical connection between the control electronics of the front display and the electronic circuitry of the rear interface and mounting unit.

43. The housing of claim 42 wherein the electronic of the rear interface and mounting unit includes a battery pack and a power supply for supplying power to the control electronics of the front display unit.

44. The housing of claim 42 wherein the front display unit supports a plurality of input keys actuatable by pressing predetermined regions of the lens.

45. The housing of claim 44 wherein the front display unit includes a lens support member disposed between the lens and the front housing and extending across at least a portion of an inward facing surface of the lens to limit inward deflection of the lens when the predetermined regions of the lens are pressed to actuate the plurality of input keys.

* * * * *

UNITED STATES PATENT AND TRADEMARK OFFICE
CERTIFICATE OF CORRECTION

PATENT NO. : 7,710,714 B2  Page 1 of 1
APPLICATION NO. : 10/939693
DATED : May 4, 2010
INVENTOR(S) : Geoffrey D. Rapp et al.

It is certified that error appears in the above-identified patent and that said Letters Patent is hereby corrected as shown below:

Col. 11, claim 1, lines 20, 21 and 23, for "enhancement", each occurrence, should read --engagement--.

Col. 12, claim 15, lines 31, 33, 34 and 36, for "enhancement", each occurrence, should read --engagement--.

Col. 13, claim 29, line 35, "enhancement" should read --engagement--.

Col. 14, claim 42, line 51, "enhancement" should read --engagement--.

Signed and Sealed this

Thirteenth Day of July, 2010

David J. Kappos
*Director of the United States Patent and Trademark Office*